(12) United States Patent
Jeon et al.

(10) Patent No.: US 12,139,811 B2
(45) Date of Patent: Nov. 12, 2024

(54) CARRIER FOIL-ATTACHED METAL FOIL, METHOD OF MANUFACTURING THE SAME, AND LAMINATE INCLUDING THE SAME

(71) Applicant: YMT CO.,LTD., Incheon (KR)

(72) Inventors: Hyun Woo Jeon, Incheon (KR); Bo Mook Chung, Incheon (KR); Sung Wook Chun, Incheon (KR)

(73) Assignee: YMT CO., LTD., Incheon (KR)

( * ) Notice: Subject to any disclaimer, the term of this patent is extended or adjusted under 35 U.S.C. 154(b) by 0 days.

(21) Appl. No.: 17/779,955

(22) PCT Filed: Oct. 15, 2020

(86) PCT No.: PCT/KR2020/014066
§ 371 (c)(1),
(2) Date: May 25, 2022

(87) PCT Pub. No.: WO2021/107397
PCT Pub. Date: Jun. 3, 2021

(65) Prior Publication Data
US 2023/0020180 A1    Jan. 19, 2023

(30) Foreign Application Priority Data
Nov. 27, 2019 (KR) .................. 10-2019-0154286

(51) Int. Cl.
*C23C 18/16* (2006.01)
*B32B 5/02* (2006.01)
(Continued)

(52) U.S. Cl.
CPC ............. *C25D 5/10* (2013.01); *B32B 5/02* (2013.01); *B32B 15/14* (2013.01); *C09D 7/63* (2018.01);
(Continued)

(58) Field of Classification Search
CPC ......... C23C 18/31; C23C 18/48; C23C 18/50; C23C 28/00; C23C 18/16; C23C 18/1653;
(Continued)

(56) References Cited

U.S. PATENT DOCUMENTS

| 10,332,756 | B2 | 6/2019 | Moriyama et al. |
| 2003/0153169 | A1 | 8/2003 | Wang et al. |
| 2010/0282500 | A1* | 11/2010 | Ryu ............... H05K 3/025 428/656 |
| 2019/0364664 | A1* | 11/2019 | Beom ............... B32B 15/20 |

FOREIGN PATENT DOCUMENTS

| CN | 101909871 A | 12/2010 |
| CN | 106460212 A | 2/2017 |

(Continued)

OTHER PUBLICATIONS

International search report of PCT/KR2020/014066, Jan. 5, 2021, English translation.
The extended European search report of 20 894 258.1, Nov. 29, 2023.

*Primary Examiner* — Edna Wong
(74) *Attorney, Agent, or Firm* — STIP Law Group, LLC

(57) ABSTRACT

The present invention relates to a carrier foil-attached metal foil including a release layer having a specific composition and structure, a method of manufacturing the carrier foil-attached metal foil, and a laminate for forming a printed circuit board including the carrier foil-attached metal foil. The laminate for forming a printed circuit board according to the present invention comprises the carrier foil-attached metal foil, so that a defect rate can be minimized.

3 Claims, 1 Drawing Sheet

(51) Int. Cl.
*B32B 15/14* (2006.01)
*C09D 7/63* (2018.01)
*C25D 3/38* (2006.01)
*C25D 3/56* (2006.01)
*C25D 5/10* (2006.01)

(52) U.S. Cl.
CPC ............... *C25D 3/38* (2013.01); *C25D 3/562* (2013.01); *B32B 2255/06* (2013.01); *B32B 2255/205* (2013.01); *B32B 2255/24* (2013.01); *B32B 2255/28* (2013.01); *B32B 2260/021* (2013.01); *B32B 2260/046* (2013.01); *B32B 2307/748* (2013.01); *B32B 2457/08* (2013.01)

(58) Field of Classification Search
CPC .......... C25D 5/34; C25D 5/44; C25D 7/0614; C25D 5/10
USPC .................. 427/402, 404; 205/196, 205, 184
See application file for complete search history.

(56) References Cited

FOREIGN PATENT DOCUMENTS

| | | | | |
|---|---|---|---|---|
| EP | 2336395 A1 | * | 6/2011 | ............. B32B 15/01 |
| JP | 4748519 B2 | | 8/2011 | |
| JP | 2012102407 A | | 5/2012 | |
| JP | 5228130 B1 | * | 7/2013 | ............. B32B 15/01 |
| JP | 2014005545 A | | 1/2014 | |
| JP | 5427847 B2 | | 2/2014 | |
| JP | 5575320 B2 | | 8/2014 | |
| JP | 2018192775 A | * | 12/2018 | ............. B32B 15/01 |
| JP | 2019019351 A | * | 2/2019 | ............. B32B 15/01 |
| KR | 20090072423 A | | 7/2009 | |
| KR | 101333515 B1 | | 11/2013 | |
| KR | 20160111985 A | | 9/2016 | |
| KR | 102137068 B1 | | 7/2020 | |
| WO | WO2015030256 A1 | | 3/2015 | |
| WO | WO-2015170715 A1 | * | 11/2015 | ............. B32B 15/08 |

* cited by examiner

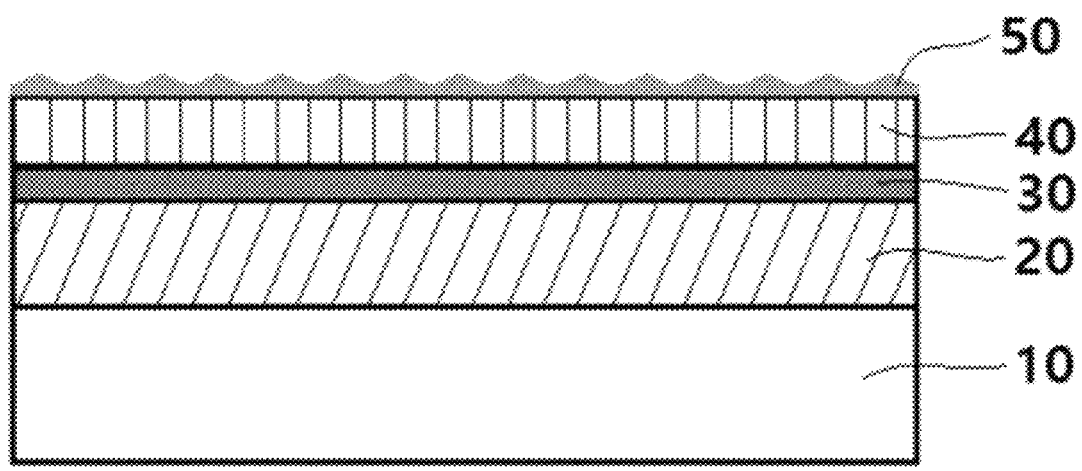

CARRIER FOIL-ATTACHED METAL FOIL, METHOD OF MANUFACTURING THE SAME, AND LAMINATE INCLUDING THE SAME

CROSS-REFERENCE TO RELATED APPLICATIONS

This application is the U.S. National Phase under 35 U.S.C. § 371 of International Application No. PCT/KR2020/014066 filed on Oct. 15, 2020, which in turn claims the benefit of Korean Application No. 10-2019-0154286 filed on Nov. 27, 2019, the disclosures of which are incorporated by reference into the present application.

TECHNICAL FIELD

The present invention relates to a carrier foil-attached metal foil, a method of manufacturing the same, and a laminate for forming a printed circuit board including the metal foil.

BACKGROUND ART

With the high integration of various electronic components, a printed circuit board having a high-density ultra-fine wiring pattern is required. Such a printed circuit board may be manufactured by forming the high-density ultra-fine wiring pattern on a metal foil included in the printed circuit board.

However, when a thickness of the metal foil included in the printed circuit board is thick, since an etching time is long when forming the wiring pattern, verticality of a sidewall of the formed wiring pattern collapses, so there may be a problem that a disconnection occurs. Accordingly, a relatively thin metal foil (e.g., a metal foil having a thickness of 9 µm or less) has been mainly used for manufacturing a printed circuit board having a high-density ultra-fine wiring pattern. Here, since the thin metal foil has a weak mechanical strength, the metal foil may be easily wrinkled or bent during the manufacturing of the printed circuit board. To compensate for this problem, a carrier foil-attached metal foil in which a carrier foil is attached to one surface of the metal foil through a release layer has been used.

After the carrier foil-attached metal foil is bonded to a resin substrate, a basic structure of the printed circuit board is formed by peeling the release layer and the carrier foil from the carrier foil-attached metal foil. Here, when peeling the release layer and the carrier foil, if the metal foil is deformed or impurities remain on the metal foil, a defect rate of the printed circuit board increases. Accordingly, it is required to stabilize a peeling strength when peeling the release layer and the carrier foil so that the impurities do not remain on the metal foil while preventing the deformation of the metal foil.

In order to stabilize the peeling strength when peeling the release layer and the carrier foil, many attempts have been made to apply an organic component or a metal component to the release layer. However, when peeling the release layer and the carrier foil, the metal foil is deformed or impurities remain on the metal foil, so the problems that cause defects in the printed circuit board still occur.

DISCLOSURE

Technical Problem

The present invention provides a carrier foil-attached metal foil capable of minimizing a deformation of a metal foil and impurities remaining on the metal foil when peeling the carrier foil from the metal foil.

In addition, the present invention provides a method of manufacturing the carrier foil-attached metal foil.

Further, the present invention provides a laminate for forming a printed circuit board with excellent reliability by including the carrier foil-attached metal foil.

Technical Solution

According to an aspect of the present invention, there is provided an carrier foil-attached metal foil, including: a carrier foil; an alloy layer provided on the carrier foil; an organic layer provided on the alloy layer; and a metal layer provided on the organic layer, in which the alloy layer includes a first component containing nickel (Ni) and a second component containing molybdenum (Mo), and a ratio a:b of the first component a and the second component b is a weight ratio of 40 to 80:60 to 20, and the organic layer includes a cyclic compound containing two or more nitrogen atoms.

According to another aspect of the present invention, there is provided a method of manufacturing a carrier foil-attached metal foil, including: preparing a carrier foil; forming an alloy layer on the carrier foil; forming an organic layer on the alloy layer; and forming a metal layer on the organic layer, in which the alloy layer is formed of a plating solution including a first component containing nickel (Ni) and a second component containing molybdenum (Mo), and a ratio a:b of the first component a and the second component b is a weight ratio of 40 to 80:60 to 20, and the organic layer is formed of a coating solution including a cyclic compound containing two or more nitrogen atoms.

According to still another aspect of the present invention, there is provided a laminate, including: the carrier foil-attached metal foil; and a resin substrate provided on the carrier foil-attached metal foil.

Advantageous Effects

As a carrier foil-attached metal foil according to the present invention includes an alloy layer containing molybdenum and nickel at a specific ratio and a release layer formed of an organic layer containing a cyclic compound containing two or more nitrogen atoms, when peeling the carrier foil from the metal foil, it is possible to prevent impurities (e.g., metal components derived from the alloy layer) from remaining on the metal foil while minimizing a deformation of the metal foil.

In addition, as a laminate for forming a printed circuit board according to the present invention includes the carrier foil-attached metal foil, a defect rate is minimized, and thus the present invention may provide a laminate for forming a printed circuit board with excellent reliability.

BRIEF DESCRIPTION OF THE DRAWINGS

FIG. 1 is a cross-sectional view of a carrier foil-attached metal foil according to the present invention.

BEST MODE

The terms and words used in the description and claims of the present invention should not to be construed as limited to ordinary or dictionary meaning, and should be interpreted in a sense and concept consistent with the technical idea of the present invention, based on the principle that the inventor can properly define the concept of a term to describe his/her own invention in the best way possible.

The present invention is to provide a carrier foil-attached metal foil having a specific composition and structure of an alloy layer and an organic layer serving as a release layer. Specifically, the present invention relates to a carrier foil-attached metal foil capable of maintaining an alloy layer and an organic layer, which are bonded to a carrier foil, at an appropriate bonding strength (peeling strength) before peeling the alloy layer and the organic layer from a metal layer, minimizing a deformation of the metal layer by smoothly peeling the alloy layer and the organic layer from the metal layer when peeling, and preventing impurities from remaining in the metal layer after peeling, a method of manufacturing the carrier foil-attached metal foil, and a laminate including the carrier foil-attached metal foil, which will be described in detail as follows.

1. Carrier Foil-Attached Metal Foil

A carrier foil-attached metal foil according to the present invention includes a carrier foil, an alloy layer, an organic layer, and a metal layer, which will be described in detail with reference to FIG. 1 as follows.

A carrier foil 10 included in the carrier foil-attached metal foil according to the present invention may serve as a support layer to prevent a deformation of the metal layer 40 during movement or use of the carrier foil-attached metal foil. The carrier foil 10 may be made of a metal such as copper or aluminum; or a polymer such as polyethylene terephthalate (PET), polyphenylene sulfide (PPS), or Teflon.

A thickness of the carrier foil 10 may be 10 to 50 μm. As the thickness of the carrier foil 10 is within the above range, it is possible to prevent the carrier foil-attached metal foil from becoming thicker than necessary while smoothly performing the role of a support layer.

The alloy layer 20 included in the carrier foil-attached metal foil according to the present invention is a first release layer provided on the carrier foil 10, and may serve to bond the carrier foil 10 and the organic layer 30 and prevent a component of the carrier foil 10 from being diffused into the metal layer 40.

The alloy layer 20 may include a first component containing nickel (Ni) and a second component containing molybdenum (Mo). Specifically, the first component is nickel, and may prevent the component of the carrier foil 10 from being diffused and adsorbed into the metal layer 40 as the nickel is contained in the alloy layer 20. The second component is molybdenum, and provides a site to which a cyclic compound included in the organic layer 30 is bonded as the molybdenum is contained in the alloy layer 20, thereby providing a required bonding strength (peeling strength) between the alloy layer 20 and the organic layer 30.

Here, a ratio a:b of the first component a and the second component b may be within 40 to 80:60 to 20, and specifically, a weight ratio of 60 to 80:40 to 20. As the ratio of the first component and the second component is within the above range, the component of the carrier foil 10 may be prevented from being diffused into the metal layer 40, and thus, may peel the carrier foil 10 so that impurities do not remain in the metal layer 40, and may provide the required bonding strength (peeling strength) before and after peeling to the alloy layer 20. In addition, even if the carrier foil-attached metal foil is heat-treated at 200° C. or higher for manufacturing of a laminate for forming a printed circuit board bonded to a resin substrate, the bonding strength (peeling strength) between the carrier foil 10, the alloy layer 20, and the organic layer 30 is maintained stably, so the carrier foil 10 may be peeled well.

Meanwhile, the alloy layer 20 may further include a third component containing at least one selected from the group consisting of cobalt (Co), phosphorus (P), manganese (Mn), and iron (Fe). As the alloy layer 20 further contains the third component, the bonding strength (peeling strength) between the alloy layer 20 and the organic layer 30 may be increased, and even when the carrier foil-attached metal foil is heat-treated at 200° C. or higher, the bonding strength (peeling strength) may be stably maintained. Here, when the alloy layer 20 further includes a third component c, a ratio a:b:c of the first component a, the second component b, and the third component c may be a weight ratio of 30 to 60:25 to 50:1 to 40.

A thickness of such an alloy layer 20 may be 30 nm to 1 μm. As the thickness of the alloy layer 20 is within the above range, the required bonding strength (peeling strength) may be exhibited while the alloy layer 20 and the organic layer 30 are stably bonded.

The organic layer 30 included in the carrier foil-attached metal foil according to the present invention is a second release layer provided on the alloy layer 20, and may serve to bond the alloy layer 20 and the metal layer 40 and prevent the component of the carrier foil 10 and the component of the alloy layer 20 from being diffused into the metal layer 40.

The organic layer 30 may include a cyclic compound containing two or more nitrogen atoms. Specifically, the cyclic compound may be at least one selected from the group consisting of benzotriazole, mercapto benzimidazole, mercapto benzotriazole, sodium mercapto benzotriazole, 3-amino-5-mercapto-1,2,4-triazole, 3-mercapto-1,2,4-triazole, triazole-5-carboxylic acid, 1-methyl-3-mercapto-1,2,4-triazole, and 1-phenyl-5-mercapto tetrazole. In particular, the cyclic compound included in the organic layer 30 may be sodium mercapto benzotriazole, mercapto benzotriazole, 3-amino-5-mercapto-1,2,4-triazole, 3-mercapto-1,2,4-triazole, 1-methyl-3-mercapto-1,2,4-triazole, or 1-phenyl-5-mercapto tetrazole to which a mercapto group (—SH) (high bonding strength with a nitrogen atom due to many unshared electron pairs) and 3 or more nitrogen atoms are bonded. Since the cyclic compound is included in the organic layer 30, the structure of the organic layer 30 may be stably maintained, thereby preventing the component of the carrier foil 10 or the component of the alloy layer 20 from being diffused and absorbed into the metal layer 40.

A thickness of the organic layer 30 may be 1 to 50 nm. As the thickness of the organic layer 30 is within the above range, the required bonding strength (peeling strength) may be exhibited while the organic layer 30 and the metal layer 40 are stably bonded.

The metal layer 40 included in the carrier foil-attached metal foil according to the present invention may serve as a circuit layer by going through the process of forming a wiring pattern in a process of manufacturing a printed wiring board. The metal layer 40 may be made of copper.

A thickness of the metal layer 40 may be 0.1 to 5 As the thickness of the metal layer 40 is within the above range, it is possible to implement a high-density ultra-fine wiring pattern while preventing micropores from being generated.

In the carrier foil-attached metal foil according to the present invention, a bonding strength (peeling strength) $S_1$ between the carrier foil 10 and the alloy layer 20 and a bonding strength (peeling strength) $S_2$ between the alloy layer 20 and the organic layer 30 may be equal, which may be greater than a bonding strength (peeling strength) $S_3$ between the organic layer and the metal layer 40 ($S_1$, $S_2$>$S_3$). Here, the bonding strength (peeling strength) $S_3$ between the organic layer 30 and the metal layer 40 may be 2 to 20 gf/cm, and specifically 5 to 15 gf/cm.

Meanwhile, the carrier foil-attached metal foil according to the present invention may further include a surface roughening layer 50 provided on the metal layer 40. The surface roughening layer 50 may serve to increase the bonding strength between the carrier foil-attached metal foil and the resin substrate when manufacturing a laminate by bonding the carrier foil-attached metal foil and the resin substrate. The surface roughening layer 50 may include copper. The surface roughening layer 50 may include a seed layer having a thickness of 0.5 to 1 μm and a cover layer having a thickness of 1.0 to 2.0 μm.

Such a surface roughening layer 50 may have an arithmetic mean roughness Ra of 0.2 to 0.3 μm, and a ten-point average roughness Rz of 1.5 to 2.5 μm. As the roughness of the surface roughening layer 50 is within the above range, the high bonding strength between the carrier foil-attached metal foil and the resin substrate may be exhibited.

In addition, the carrier foil-attached metal foil according to the present invention may further include a diffusion barrier layer (not illustrated) provided between the carrier foil 10 and the alloy layer 20. The diffusion barrier layer may include nickel and phosphorus.

In addition, the carrier foil-attached metal foil according to the present invention may further include an antioxidant layer (not illustrated) provided between the organic layer 30 and the metal layer 40. The antioxidant layer may include nickel and phosphorus.

2. Method of Manufacturing Carrier Foil-Attached Metal Foil

The present invention provides a method of manufacturing a carrier foil-attached metal foil, which will be described in detail as follows.

a) Preparation of Carrier Foil

First, a carrier foil is prepared. Specifically, a metal foil film made of copper or aluminum; or a polymer thin film made of polyethylene terephthalate (PET), polyphenylene sulfide (PPS), or Teflon may be prepared as a carrier foil.

b) Formation of Alloy Layer

An alloy layer is formed on the prepared carrier foil. The alloy layer may be formed by electroplating or electroless plating. In the electroplating or electroless plating, a plating solution including a first component containing nickel (Ni) and a second component containing molybdenum (Mo) may be used.

Here, a ratio a:b of a first component a and a second component b may be a weight ratio of 40 to 80:60 to 20. As the ratio of the first component and the second component is within the above range, the carrier foil, the alloy layer, and the organic layer may be well bonded to prevent the component of the carrier foil from being diffused into the metal layer.

Meanwhile, the plating solution may further include a third component containing at least one selected from the group consisting of cobalt (Co), phosphorus (P), manganese (Mn), and iron (Fe).

c) Formation of Organic Layer

Next, an organic layer is formed on the formed alloy layer. The organic layer may be formed by a coating method such as an immersion method, a showering method, or a spray method. In the coating method, a coating solution including a cyclic compound containing two or more nitrogen atoms may be used.

The cyclic compound may be at least one selected from the group consisting of benzotriazole, mercapto benzimidazole, mercapto benzotriazole, sodium mercapto benzotriazole, 3-amino-5-mercapto-1,2,4-triazole, 3-mercapto-1,2,4-triazole, triazole-5-carboxylic acid, 1-methyl-3-mercapto-1,2,4-triazole, and 1-phenyl-5-mercapto tetrazole. In particular, the cyclic compound may be sodium mercapto benzotriazole, mercapto benzotriazole, 3-amino-5-mercapto-1,2,4-triazole, 3-mercapto-1,2,4-triazole, 1-methyl-3-mercapto-1,2,4-triazole, or 1-phenyl-5-mercapto tetrazole, to which a mercapto group (—SH) (high bonding strength with a nitrogen atom due to many unshared electron pairs) and 3 or more nitrogen atoms are bonded.

The content of this cyclic compound may be 0.1 to 2 parts by weight based on 100 parts by weight of the coating solution. As the content of the cyclic compound is within the above range, the amount of the cyclic compound adsorbed into the metal layer is optimized, thereby preventing an appearance from being deteriorated while increasing bonding strength (peeling strength).

d) Formation of Metal Layer

Then, a metal layer is formed on the formed organic layer. The metal layer may be formed by a plating method such as electroplating or electroless plating; or a deposition method such as chemical vapor deposition (CVC), physical chemical vapor deposition (PVC), or ion plating.

The method of manufacturing a carrier foil-attached metal foil according to the present invention may further include forming a surface roughening layer on the metal layer. The surface roughening layer may be formed by going through a process of primary electroplating (forming a seed layer) and secondary electroplating (forming a cover layer). The primary electroplating may be performed using an electroplating solution containing 60 to 70 g/L of copper and 150 to 170 g/L of sulfuric acid under conditions of a temperature of 25° C. and a current density of 15 ASD. The secondary electroplating may be performed using an electroplating solution containing 220 to 240 g/L of copper and 120 to 140 g/L of sulfuric acid under conditions of a temperature of 45° C. and a current density of 15 ASD.

In addition, the method of manufacturing a carrier foil-attached metal foil according to the present invention may further include forming a diffusion barrier layer between the carrier foil and the alloy layer.

In addition, the method of manufacturing a carrier foil-attached metal foil according to the present invention may further include forming an antioxidant layer between the organic layer 30 and the metal layer 40.

3. Laminate

The present invention provides a laminate including a carrier foil-attached metal foil and a resin substrate.

The carrier foil-attached metal foil included in the laminate according to the present invention may serve as a circuit layer on which a wiring pattern is formed. The description of this carrier foil-attached metal foil is the same as described above, and therefore, will be omitted.

The resin substrate included in the laminate according to the present invention serves as an insulating layer. The resin substrate is commonly known and may have a structure in which inorganic or organic fibers are impregnated with resin. The resin may be at least one selected from the group consisting of naphthalene-based epoxy resins, bisphenol A-type epoxy resins, phenol novolac epoxy resins, cresol novolac epoxy resins, rubber-modified epoxy resins, phosphorus-based epoxy resins, and bisphenol F-type epoxy resins.

The laminate according to the present invention is a laminate for forming a printed circuit board, and as the laminate includes the above-described carrier foil-attached metal foil, a defect rate is minimized, so the laminate may be used as a laminate for forming a printed circuit board with excellent reliability.

Hereinafter, the present invention will be described in more detail by way of Examples. However, the following examples are intended to illustrate the present invention, and it is apparent to those skilled in the art that various changes and modifications can be made within the scope and spirit of the present invention, and the scope of the present invention is not limited thereto.

Example 1

A carrier foil formed of a copper foil having a thickness of 18 μm was immersed in 5 wt % of sulfuric acid, pickled, and then washed with pure water. The washed carrier foil was electroplated with a plating solution (aqueous solution containing 50 g/L of nickel sulfate, 60 g/L of sodium molybdate, and 50 g/L of citric acid) containing nickel (first component) and molybdenum (second component) to form an alloy layer (nickel:molybdenum ratio=weight ratio of 60:40) having a thickness of 200 nm. In this case, the electroplating was performed at 5 A/dm$^2$ for 30 seconds while maintaining pH 10 or higher.

The carrier foil on which the alloy layer is formed was washed, and then, was immersed for 30 seconds in a coating solution of 30° C. which contains 1 part by weight of sodium mercapto benzotriazole and 99 parts by weight of pure water to form an organic layer having a thickness of 1 to 10 nm on the alloy layer.

The carrier foil on which the alloy layer and the organic layer were formed was washed, and then, electroplated to form a metal layer (electrolytic copper layer) having a thickness of 2 μm to manufacture the carrier foil-attached metal foil. In this case, a copper sulfate solution of 23° C. having a copper concentration of 150 g/L and a free sulfuric acid concentration of 100 g/L was used for the electroplating, and a current density was 5 A/dm$^2$.

Example 2

A carrier foil-attached metal foil was manufactured in the same process as in Example 1, except that benzotriazole was used instead of sodium mercapto benzotriazole when forming an organic layer.

Example 3

A carrier foil-attached metal foil was manufactured in the same process as in Example 1, except that mercapto benzimidazol was used instead of sodium mercapto benzotriazole when forming an organic layer.

Example 4

A carrier foil-attached metal foil was manufactured in the same process as in Example 1, except that an alloy layer was formed by adjusting a plating solution composition so that a ratio of nickel:molybdenum was a weight ratio of 80:20.

Example 5

A carrier foil-attached metal foil was manufactured in the same process as in Example 1, except that an alloy layer was formed by adjusting a plating solution composition so that a ratio of nickel:molybdenum was a weight ratio of 40:60.

Example 6

A carrier foil-attached metal foil was manufactured in the same process as in Example 1, except that an alloy layer (ratio of nickel:molybdenum:cobalt=weight ratio of 50:35:15) was formed with a plating solution containing nickel (first component), molybdenum (second component), and cobalt (third component) instead of a plating solution containing nickel and molybdenum.

Example 7

A carrier foil-attached metal foil was manufactured in the same process as in Example 1, except for forming an alloy layer (ratio of nickel:molybdenum:phosphorus=weight ratio of 55:42:3) with a plating solution containing nickel (first component), molybdenum (second component), and phosphorus (third component) instead of a plating solution containing nickel and molybdenum.

Example 8

A carrier foil-attached metal foil was manufactured in the same process as in Example 1, except that an alloy layer (ratio of nickel:molybdenum:manganese=weight ratio of 40:35:25) was formed with a plating solution containing nickel (first component), molybdenum (second component), and manganese (third component) instead of a plating solution containing nickel and molybdenum.

Example 9

A carrier foil-attached metal foil was manufactured in the same process as in Example 1, except that an alloy layer (ratio of nickel:molybdenum:iron:phosphorus=weight ratio of 43:40:15:2) was formed with a plating solution containing nickel (first component), molybdenum (second component), manganese (third component), and phosphorus (fourth component) instead of a plating solution containing nickel and molybdenum.

Comparative Example 1

A carrier foil-attached metal foil was manufactured in the same process as in Example 1, except that an organic layer was not formed.

Comparative Example 2

A carrier foil-attached metal foil was manufactured in the same process as in Example 1, except that an organic layer (ratio of nickel:iron=weight ratio of 70:30) was formed with a plating solution containing nickel and iron instead of a plating solution containing nickel and molybdenum.

Comparative Example 3

A carrier foil-attached metal foil was manufactured in the same process as in Example 1, except that an organic layer (ratio of nickel:cobalt=weight ratio of 70:30) was formed with a plating solution containing nickel and cobalt instead of a plating solution containing nickel and molybdenum.

Comparative Example 4

A carrier foil-attached metal foil was manufactured in the same process as in Example 1, except that an organic layer (ratio of iron:molybdenum=weight ratio of 70:30) was formed with a plating solution containing iron and molybdenum instead of a plating solution containing nickel and molybdenum.

Comparative Example 5

A carrier foil-attached metal foil was manufactured in the same process as in Example 1, except that an alloy layer was formed by adjusting a plating solution composition so that a ratio of nickel:molybdenum was a weight ratio of 85:15.

Comparative Example 6

A carrier foil-attached metal foil was manufactured in the same process as in Example 1, except that an alloy layer was formed by adjusting a plating solution composition so that a ratio of nickel:molybdenum was a weight ratio of 35:65. In this case, as the ratio of nickel:molybdenum was a weight ratio of 35:65, the electroplating was not performed well, so the alloy layer was not properly formed. As a result, the bonding strength between the subsequently formed organic layer and the metal layer was low, making it difficult to use as the carrier foil-attached metal foil.

Manufacturing Examples 1 to 9 and Comparative Manufacturing Examples 1 to 5

A laminate was manufactured by forming a resin substrate (Doosan Electronics prepreg (DS-7409HG)) laminated on the carrier foil-attached metal foil manufactured in Examples 1 to 9 and Comparative Examples 1 to 5 and then pressing the resin substrate at a pressure of 220 MPa at 220° C. for 100 minutes.

Experimental Example 1

The peeling strength (gf/cm) of the carrier foil-attached metal foil manufactured in Examples 1 to 9 and Comparative Examples 1 to 5 and the laminate manufactured in Manufacturing Examples 1 to 9 and Comparative Manufacturing Examples 1 to 5 was measured by IPC-TM-650 standard (using a plate-shaped test piece having width of 10 mm×length of 10 cm), and the results were shown in Table 1 below. Here, the peeling strength means the peeling strength between the metal layer and the structure in which the organic layer/alloy layer/carrier foil are bonded.

TABLE 1

| | Alloy layer composition (Ratio: weight ratio) | Organic layer Cyclic compound (coating solution content) | Example Peeling strength (before press) | Manufacturing example Peeling strength (after press) | Comparative example Peeling strength (before press) | Comparative and manufacturing example Peeling strength (after press) |
|---|---|---|---|---|---|---|
| 1 | Ni60:Mo40 | Sodium mercapto benzotriazole (1 part by weight) | 10 | 10 | — | — |
| 2 | Ni60:Mo40 | Benzotriazole (1 part by weight) | 10 | 43 | — | — |
| 3 | Ni60:Mo40 | Mercapto benzimidazole (1 part by weight) | 10 | 36 | — | — |
| 4 | Ni80:Mo20 | Sodium mercapto benzotriazole (1 part by weight) | 10 | 30 | — | — |
| 5 | Ni40:Mo60 | Sodium mercapto benzotriazole (1 part by weight) | 8 | 5 | — | — |
| 6 | Ni50:Mo35:Co15 | Sodium mercapto benzotriazole (1 part by weight) | 10 | 10 | — | — |
| 7 | Ni55:Mo42:P3 | Sodium mercapto benzotriazole (1 part by weight) | 10 | 10 | — | — |
| 8 | Ni40:Mo35:Mn25 | Sodium mercapto benzotriazole (1 part by weight) | 20 | 10 | — | — |
| 9 | Ni35:Mo30:Fe30:P3 | Sodium mercapto benzotriazole | 10 | 10 | — | — |

TABLE 1-continued

| | Alloy layer composition (Ratio: weight ratio) | Organic layer Cyclic compound (coating solution content) | Example Peeling strength (before press) | Manufacturing example Peeling strength (after press) | Comparative example Peeling strength (before press) | Comparative and manufacturing example Peeling strength (after press) |
|---|---|---|---|---|---|---|
| 1 | Ni60:Mo40 | (1 part by weight) Untreatment | — | — | 10 | Non-peelable (100 or more) |
| 2 | Ni70:Fe30 | Sodium mercapto benzotriazole (1 part by weight) | — | — | Non-peelable (100 or more) | Non-peelable (100 or more) |
| 3 | Ni70:Co30 | Sodium mercapto benzotriazole (1 part by weight) | — | — | Non-peelable (100 or more) | Non-peelable (100 or more) |
| 4 | Fe70:Mo30 | Sodium mercapto benzotriazole (1 part by weight) | — | — | 10 | Non-peelable (100 or more) |
| 5 | Ni85:Mo15 | Sodium mercapto benzotriazole (1 part by weight) | — | — | 10 | 80 |

Referring to the above Table 1, the carrier foil-attached metal foil (Examples 1 to 9) of Manufacturing Examples 1 to 9 according to the present invention maintained the bonding with the carrier foil due to the alloy layer and organic layer, and then, was peeled well, but it was confirmed that the carrier foil-attached metal foil of Comparative Manufacturing Examples 1 to 4 was not peeled. In addition, it was confirmed that the carrier foil-attached metal foil of Comparative Manufacturing Example 5 was pressed and then not easily peeled due to high peeling strength.

Experimental Example 2

The surface of the metal layer obtained through the peeling process after pressing in Experimental Example 1 was analyzed by XPS to confirm whether the component of the alloy layer remains in the metal layer, and the results were shown in Table 2 below.

TABLE 2

| Component | Analysis of surface of metal layer separated from metal foil of Example 1 (Atomic %) | Analysis of surface of metal layer separated from metal foil of Comparative Example 1 (Atomic %) |
|---|---|---|
| Cu2p3 | 9.23 | 6.74 |
| O1s | 23.59 | 23.98 |
| C1s | 61.68 | 49.57 |
| Ni2p3 | — | 5.08 |
| N1s | 4.35 | 11.61 |
| S2p | — | 3.01 |
| Cl2p | 1.16 | — |

Referring to Table 2, in the carrier foil-attached metal foil of Example 1 according to the present invention, the component of the alloy layer (nickel) does not remain (nickel residue 0%) on the surface of the metal layer after peeling, but in the carrier foil-attached metal foil of Comparative Example 1, it was confirmed that a large amount of the component of the alloy layer (nickel) remains on the surface of the metal layer after peeling (nickel residue 5.08%).

The invention claimed is:
1. A method of manufacturing a carrier foil-attached metal foil, comprising:
preparing a carrier foil, wherein the carrier foil includes copper or aluminum;
forming an alloy layer on the carrier foil by electrolytic plating or electroless plating, wherein the alloy layer has a thickness 30 nm to 1 μm;
forming an organic layer on the alloy layer, wherein the organic layer has a thickness 1 nm to 50 nm;
forming a metal layer on the organic layer, and
forming a surface roughening layer on the metal layer, wherein,
the alloy layer is formed from a plating solution including a first component containing nickel (Ni) and a second component containing molybdenum (Mo), wherein the alloy layer comprises the first component and the second component and a ratio of the first component and the second component in the alloy layer is a weight ratio of 60 to 80:40 to 20,
the organic layer is formed from coating a coating solution including a cyclic compound containing two or more nitrogen atoms by immersion, showering, or spray method,
the nickel (Ni) of the alloy layer prevents the copper or the aluminum of the carrier foil from diffusing into the metal layer, the molybdenum (Mo) provides a site where the cyclic compound is bonded, the surface roughening layer is formed by going through a primary electroplating and a secondary electroplating, the primary electroplating is performed using a first electroplating solution containing 60 to 70 g/L of copper and 150 to 170 g/L of sulfuric acid, and the secondary electroplating is performed using a second electroplating solution containing 220 to 240 g/L of copper and 120 to 140 g/L of sulfuric acid.

2. The method of claim 1, wherein a content of the cyclic compound is 0.1 to 2 parts by weight based on 100 parts by weight of the coating solution.

3. The method of claim 1, wherein the plating solution further includes a third component containing at least one selected from the group consisting of cobalt (Co), phosphorus (P), manganese (Mn), and iron (Fe).

* * * * *